(12) United States Patent
Khlat (10) Patent No.: US 11,539,330 B2
(45) Date of Patent: Dec. 27, 2022

(54) ENVELOPE TRACKING INTEGRATED CIRCUIT SUPPORTING MULTIPLE TYPES OF POWER AMPLIFIERS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 67 days.

(21) Appl. No.: 17/148,064

(22) Filed: Jan. 13, 2021

(65) Prior Publication Data

US 2021/0226585 A1    Jul. 22, 2021

Related U.S. Application Data

(60) Provisional application No. 62/962,616, filed on Jan. 17, 2020.

(51) Int. Cl.
*H03F 3/04* (2006.01)
*H03F 1/02* (2006.01)
*H03F 3/213* (2006.01)

(52) U.S. Cl.
CPC .......... *H03F 1/0233* (2013.01); *H03F 3/213* (2013.01); *H03F 1/0211* (2013.01);
(Continued)

(58) Field of Classification Search
CPC .. H03F 1/0233; H03F 3/213; H03F 2200/105; H03F 2200/451; H03F 3/19;
(Continued)

(56) References Cited

U.S. PATENT DOCUMENTS 5,510,753 A    4/1996 French
5,838,732 A    11/1998 Carney
(Continued)

FOREIGN PATENT DOCUMENTS

EP    3174199 A2    5/2012
JP    H03104422 A    5/1991
(Continued)

OTHER PUBLICATIONS

Chen, S. et al., "A 4.5 μW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.

(Continued)

*Primary Examiner* — Khanh V Nguyen
(74) *Attorney, Agent, or Firm* — Withrow & Terranova, P.L.L.C.

(57) ABSTRACT

An envelope tracking (ET) integrated circuit (ETIC) supporting multiple types of power amplifiers. The ETIC includes a pair of tracker circuits configured to generate a pair of low-frequency currents at a pair of output nodes, respectively. The ETIC also includes a pair of ET voltage circuits configured to generate a pair of ET voltages at the output nodes, respectively. In various embodiments disclosed herein, the ETIC can be configured to generate the low-frequency currents independent of what type of power amplifier is coupled to the output nodes. Concurrently, the ETIC can also generate the ET voltages in accordance with the type of power amplifier coupled to the output nodes. As such, it is possible to support multiple types of power amplifiers based on a single ETIC, thus helping to reduce footprint, power consumption, and heat dissipation in an electronic device employing the ETIC and the multiple types of power amplifiers.

20 Claims, 4 Drawing Sheets

(52) U.S. Cl.
CPC ...... *H03F 1/0244* (2013.01); *H03F 2200/105* (2013.01); *H03F 2200/451* (2013.01)

(58) Field of Classification Search
CPC .......... H03F 3/245; H03F 3/68; H03F 1/0227; H03F 3/04; H03F 1/0244; H03F 1/0211; H03F 2200/504
USPC ........................................................ 330/297
See application file for complete search history.

(56) References Cited

U.S. PATENT DOCUMENTS

| | | |
|---|---|---|
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 * | 1/2016 | Khlat .................... H03F 3/72 |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,680,556 B2 * | 6/2020 | Khlat ........................ H03F 3/21 |
| 10,756,675 B2 * | 8/2020 | Leipold .................... H03F 3/19 |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |

(56) References Cited

U.S. PATENT DOCUMENTS

| | | |
|---|---|---|
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0005619 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0382061 A1 | 12/2020 | Khlat |
| 2020/0382066 A1 | 12/2020 | Khlat |
| 2021/0036604 A1 | 2/2021 | Khlat et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194522 A1 | 6/2021 | Stockert et al. |
| 2021/0211108 A1 | 7/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |

FOREIGN PATENT DOCUMENTS

| | | |
|---|---|---|
| WO | 2018182778 A1 | 10/2018 |
| WO | 2020206246 A1 | 10/2020 |
| WO | 2021016350 A1 | 1/2021 |
| WO | 2021046453 A1 | 3/2021 |

OTHER PUBLICATIONS

Ying, K. et al., "A Wideband Envelope Detector with Low Ripple and High Detection Speed," 2018 IEEE International Symposium on Circuits and Systems (ISCAS), May 27-30, 2018, IEEE, 5 pages.

Notice of Allowance for U.S. Appl. No. 17/011,313, dated Nov. 4, 2021, 8 pages.

Non-Final Office Action for U.S. Appl. No. 16/597,952, dated Nov. 10, 2021, 9 pages.

Quayle Action for U.S. Appl. No. 16/855,154, mailed Oct. 25, 2021, 6 pages.

Notice of Allowance for U.S. Appl. No. 17/115,982, dated Nov. 12, 2021, 8 pages.

Non-Final Office Action for U.S. Appl. No. 17/126,561, dated Oct. 14, 2021, 6 pages.

Non-Final Office Action for U.S. Appl. No. 17/073,764, dated Dec. 24, 2021, 22 pages.

International Search Report and Written Opinion for International Patent Application No. PCT/US2021/052151, dated Jan. 4, 2022, 16 pages.

Wan, F. et al., "Negative Group Delay Theory of a Four-Port RC-Network Feedback Operational Amplifier," IEEE Access, vol. 7, Jun. 13, 2019, IEEE, 13 pages.

Notice of Allowance for U.S. Appl. No. 16/834,049, dated Jun. 24, 2021, 8 pages.

Notice of Allowance for U.S. Appl. No. 15/964,762, dated Mar. 18, 2019, 7 pages.

Quayle Action for U.S. Appl. No. 16/589,940, mailed Dec. 4, 2020, 8 pages.

Notice of Allowance for U.S. Appl. No. 16/122,611, dated Jan. 13, 2021, 8 pages.

Notice of Allowance for U.S. Appl. No. 16/284,023, dated Jan. 19, 2021, 7 pages.

Notice of Allowance for U.S. Appl. No. 16/416,812, dated Feb. 16, 2021, 8 pages.

Non-Final Office Action for U.S. Appl. No. 16/689,236 dated Mar. 2, 2021, 15 pages.

Notice of Allowance for U.S. Appl. No. 16/435,940, dated Dec. 21, 2020, 7 pages.

Notice of Allowance for U.S. Appl. No. 16/774,060, dated Feb. 3, 2021, 7 pages.

Notice of Allowance for U.S. Appl. No. 16/590,790, dated Jan. 27, 2021, 7 pages.

Notice of Allowance for U.S. Appl. No. 16/661,061, dated Feb. 10, 2021, 7 pages.

Notice of Allowance for U.S. Appl. No. 16/122,611, dated Apr. 1, 2021, 8 pages.

Non-Final Office Action for U.S. Appl. No. 16/582,471, dated Mar. 24, 2021, 11 pages.

Notice of Allowance for U.S. Appl. No. 16/582,471, dated Feb. 1, 2022, 9 pages.

(56) References Cited

OTHER PUBLICATIONS

Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Notice of Allowance for U.S. Appl. No. 15/984,566, dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, mailed Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Non-Final Office Action for U.S. Appl. No. 17/163,642, dated Aug. 17, 2022, 9 pages.

(56) References Cited

OTHER PUBLICATIONS

Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.

\* cited by examiner

ENVELOPE TRACKING INTEGRATED CIRCUIT SUPPORTING MULTIPLE TYPES OF POWER AMPLIFIERS

RELATED APPLICATIONS

This application claims the benefit of provisional patent application Ser. No. 62/962,616, filed Jan. 17, 2020, the disclosure of which is incorporated herein by reference in its entirety.

FIELD OF THE DISCLOSURE

The technology of the disclosure relates generally to an envelope tracking (ET) integrated circuit (ETIC) capable of supporting multiple types of power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) based on such spatial multiplexing/diversity schemes as multiple-input multiple-output (MIMO) and RF beamforming. As such, the 5G-NR mobile communication device typically employs a power management circuit(s) to drive a power amplifier(s) for amplifying the RF signal(s) before feeding the RF signal(s) to an antenna(s).

Notably, the 5G-NR mobile communication device may include multiple types of power amplifiers (e.g., differential power amplifier, single-stage power amplifier, multi-stage power amplifier, balanced power amplifier, etc.), each adapted to and/or optimized for a specific type of application and/or transmission scheme. For example, a differential power amplifier or a multi-stage power amplifier is more efficient for amplifying a same RF signal for transmission based on a spatial diversity scheme, while a balanced power amplifier will be better suited for amplifying different RF signals for transmission based on a spatial multiplexing scheme. In this regard, it is desirable to configure the 5G-NR mobile communication device to efficiently support a variety of power amplifiers based on as lesser number of power management circuits as possible.

SUMMARY

Embodiments of the disclosure relate to an envelope tracking (ET) integrated circuit (ETIC) supporting multiple types of power amplifiers. The ETIC includes a pair of tracker circuits configured to generate a pair of low-frequency currents at a pair of output nodes, respectively. The ETIC also includes a pair of ET voltage circuits configured to generate a pair of ET voltages at the output nodes, respectively. In various embodiments disclosed herein, the ETIC can be configured to generate the low-frequency currents independent of what type of power amplifier is coupled to the output nodes. In the meantime, the ETIC can also be configured to generate the ET voltages in accordance with the type of power amplifier that is coupled to the output nodes. As such, it is possible to support multiple types of power amplifiers based on a single ETIC, thus helping to reduce footprint, power consumption, and heat dissipation in an electronic device employing the ETIC and the multiple types of power amplifiers.

In one aspect, an ETIC is provided. The ETIC includes a first output node and a second output node coupled to a power amplifier. The ETIC also includes a first tracker circuit configured to generate a first low-frequency current at the first output node. The ETIC also includes a second tracker circuit configured to generate a second low-frequency current at the second output node. The ETIC also includes a first ET voltage circuit configured to generate a first ET voltage at the first output node based on a first ET target voltage. The ETIC also includes a second ET voltage circuit configured to generate a second ET voltage at the second output node based on a second ET target voltage. The ETIC also includes a control circuit. The control circuit is configured to determine a type of the power amplifier. The control circuit is also configured to cause the first tracker circuit and the second tracker circuit to generate the first low-frequency current and the second low-frequency current, respectively, independent of the type of the power amplifier. The control circuit is also configured to cause the first ET voltage circuit and the second ET voltage circuit to generate the first ET voltage and the second ET voltage, respectively, in accordance with the type of the power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (ETIC) supporting multiple types of power amplifiers. The ETIC includes a pair of tracker circuits configured to generate a pair of low-frequency currents at a pair of output nodes, respectively. The ETIC also includes a pair of ET voltage circuits configured to generate a pair of ET voltages at the output nodes, respectively. In various embodiments disclosed herein, the ETIC can be configured to generate the low-frequency currents independent of what type of power amplifier is coupled to the output nodes. In the meantime, the ETIC can also be configured to generate the ET voltages in accordance with the type of power amplifier that is coupled to the output nodes. As such, it is possible to support multiple types of power amplifiers based on a single ETIC, thus helping to reduce footprint, power consumption, and heat dissipation in an electronic device employing the ETIC and the multiple types of power amplifiers.

Figure 1:
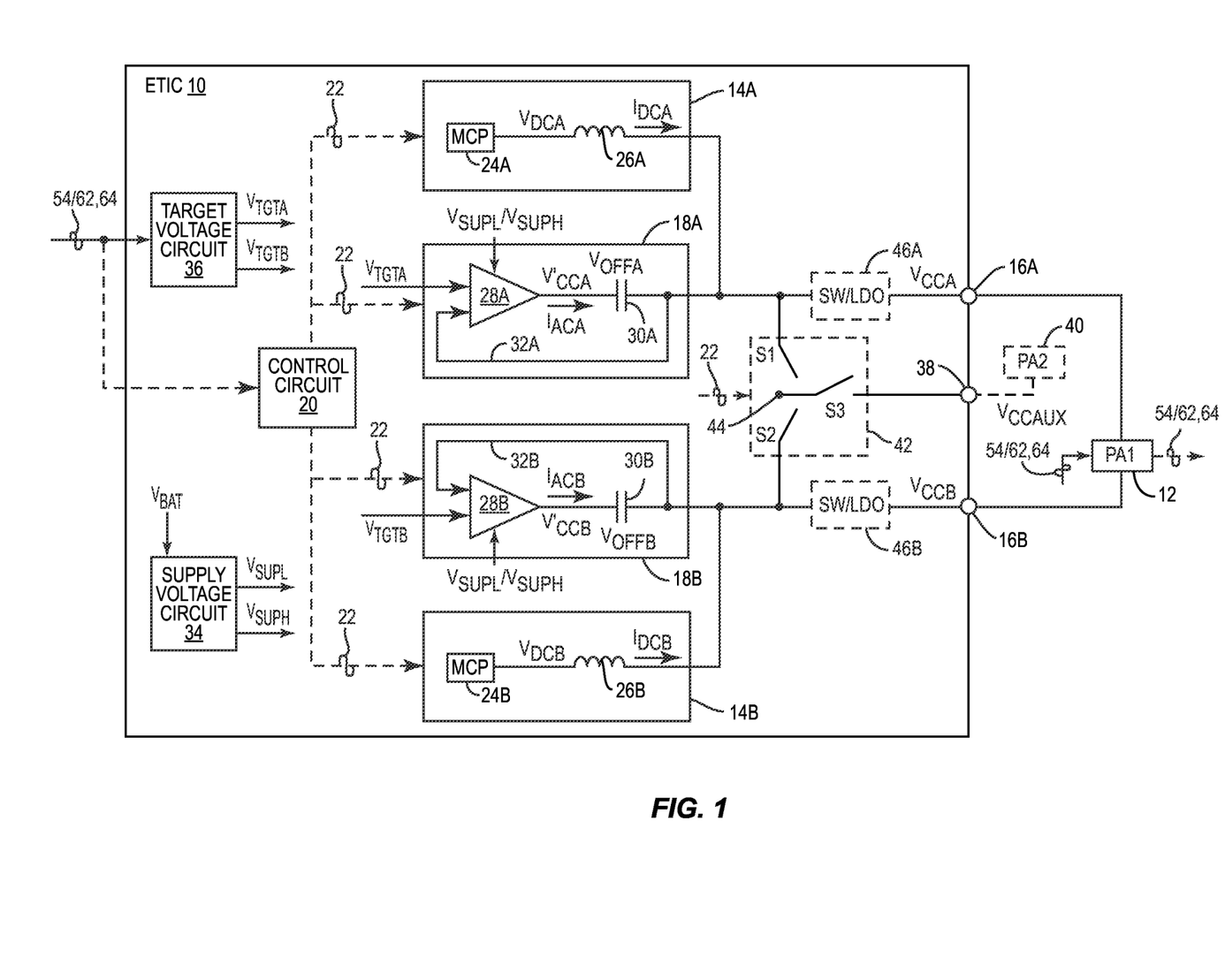
FIG. 1 is a schematic diagram of an exemplary envelope tracking (ET) integrated circuit (ETIC) that can be configured according to various embodiments of the present disclosure to support different types of power amplifiers.

In this regard, FIG. 1 is a schematic diagram of an exemplary ETIC 10 that can be configured according to various embodiments of the present disclosure to support a power amplifier 12 (denoted as "PA1") of different types. Although FIG. 1 shows only one power amplifier 12, it should be appreciated that the ETIC 10 can support more than one power amplifier 12, either concurrently or independently. The ETIC 10 can be configured to include at least a first tracker circuit 14A and a second tracker circuit 14B. The first tracker circuit 14A is configured to generate a first low-frequency current $I_{DCA}$ (e.g., a constant current) at a first output node 16A. The second tracker circuit 14B is configured to generate a second low-frequency current $I_{DCB}$ (e.g., a constant current) at a second output node 16B. In a non-limiting example, both the first output node 16A and the second output node 16B are coupled to the power amplifier 12.

The ETIC 10 also includes at least a first ET voltage circuit 18A and a second ET voltage circuit 18B. The first ET voltage circuit 18A is configured to generate a first ET voltage $V_{CCA}$ at the first output node 16A based on a first ET target voltage $V_{TGTA}$. The second ET voltage circuit 18B is configured to generate a second ET voltage $V_{CCB}$ at the second output node 16B based on a second ET target voltage $V_{TGTB}$.

The ETIC 10 further includes a control circuit 20, which can be any type of microcontroller, microprocessor, and field-programmable gate array (FPGA), as an example. The control circuit 20 can be configured to determine a type of the power amplifier 12 being coupled to the first output node 16A and the second output node 16B (e.g., based on stored configuration information). Accordingly, the control circuit 20 can control the ETIC 10 to generate the first low-frequency current $I_{DCA}$, the second low-frequency current $I_{DCB}$, the first ET voltage $V_{CCA}$, and the second ET voltage $V_{CCB}$ that are appropriate for the determined type of the power amplifier 12.

Specifically, the control circuit 20 controls the first tracker circuit 14A and the second tracker circuit 14B (e.g., via a control signal 22) to generate the first low-frequency current $I_{DCA}$ and the second low-frequency current $I_{DCB}$, respectively, independent of the type of the power amplifier 12. In a non-limiting example, the first tracker circuit 14A and the second tracker circuit 14B each generates one-half (½) of a total low-frequency current required by the power amplifier 12. In other words, the first low-frequency current $I_{DCA}$ is identical to the second low-frequency current $I_{DCB}$ ($I_{DCA}=I_{DCB}$).

In contrast, the control circuit 20 controls the first ET voltage circuit 18A and the second ET voltage circuit 18B (e.g., via the control signal 22) to generate the first ET voltage $V_{CCA}$ and the second ET voltage $V_{CCB}$, respectively, in accordance with the determined type of the power amplifier 12. In addition, the control circuit 20 may further cause the first ET voltage circuit 18A and the second ET voltage circuit 18B (e.g., via the control signal 22) to source a first high-frequency current $I_{ACA}$ (e.g., an alternating current) and a second high-frequency current $I_{ACB}$ (e.g., an alternating current), respectively, in accordance with the determined type of the power amplifier 12. As such, it is possible to support the power amplifier 12 of different types based on a single one of the ETIC 10, thus helping to reduce footprint, power consumption, and heat dissipation in an electronic device (e.g., a wireless communication device) employing the ETIC 10 and the power amplifier 12.

The first tracker circuit 14A includes a first multi-level charge pump (MCP) 24A configured to generate a first low-frequency voltage $V_{DCA}$ (e.g., a constant voltage) at multiple levels. The first tracker circuit 14A also includes a first power inductor 26A coupled between the first MCP 24A and the first output node 16A. The first power inductor 26A is configured to induce the first low-frequency current $I_{DCA}$ based on the first low-frequency voltage $V_{DCA}$.

Likewise, the second tracker circuit 14B includes a second MCP 24B configured to generate a second low-frequency voltage $V_{DCB}$ (e.g., a constant voltage) at multiple levels. The second tracker circuit 14B also includes a second power inductor 26B coupled between the second MCP 24B and the second output node 16B. The second power inductor 26B is configured to induce the second low-frequency current $I_{DCB}$ based on the second low-frequency voltage $V_{DCB}$. Notably, since the first power inductor 26A and the second power inductor 26B each induces ½ of the total low-frequency current required by the power amplifier 12, each of the first power inductor 26A and the second power inductor 26B can be significantly smaller (e.g., 2.2 µH) than a power inductor required to induce the total low-frequency current required by the power amplifier 12.

The first ET voltage circuit 18A includes a first voltage amplifier 28A. The first voltage amplifier 28A is biased by one of a lower supply voltage $V_{SUPL}$ and a higher supply voltage $V_{SUPH}$ and configured to generate a first initial ET voltage $V'_{CCA}$ that tracks (rises and falls) the first ET target voltage $V_{TGTA}$. The first ET voltage circuit 18A also includes a first offset capacitor 30A coupled between the first voltage amplifier 28A and the first output node 16A. The first offset capacitor 30A is configured to raise the first initial ET voltage $V'_{CCA}$ by a first offset voltage $V_{OFFA}$ to generate the first ET voltage $V_{CCA}$ ($V_{CCA}=V'_{CCA}+V_{OFFA}$) at the first output node 16A. The first ET voltage circuit 18A further includes a first feedback loop 32A configured to provide a feedback of the first ET voltage $V_{CCA}$ to the first voltage amplifier 28A, thus making the first ET voltage circuit 18A a closed-loop ET voltage circuit.

Similarly, the second ET voltage circuit 18B includes a second voltage amplifier 28B. The second voltage amplifier 28B is biased by one of the lower supply voltage $V_{SUPL}$ and the higher supply voltage $V_{SUPH}$ and configured to generate a second initial ET voltage $V'_{CCB}$ that tracks (rises and falls) the second ET target voltage $V_{TGTB}$. The second ET voltage circuit 18B also includes a second offset capacitor 30B coupled between the second voltage amplifier 28B and the second output node 16B. The second offset capacitor 30B is configured to raise the second initial ET voltage $V'_{CCB}$ by a second offset voltage $V_{OFFB}$ to generate the second ET voltage $V_{CCB}$ ($V_{CCB}=V'_{CCB}+V_{OFFB}$) at the second output node 16B. The second ET voltage circuit 18B further includes a second feedback loop 32B configured to provide a feedback of the second ET voltage $V_{CCB}$ to the second voltage amplifier 28B, thus making the second ET voltage circuit 18B a closed-loop ET voltage circuit.

The ETIC 10 includes a supply voltage circuit 34 configured to generate the lower supply voltage $V_{SUPL}$ and the higher supply voltage $V_{SUPH}$ based on a battery voltage $V_{BAT}$. In a non-limiting example, the supply voltage circuit 34 is configured to generate the lower supply voltage $V_{SUPL}$ that equals the battery voltage $V_{BAT}$ ($V_{SUPL}=V_{BAT}$) and the higher supply voltage $V_{SUPH}$ that equals two times the battery voltage $V_{BAT}$ ($V_{SUPH}=2*V_{BAT}$). The ETIC 10 also includes a target voltage circuit 36 configured to generate the first ET target voltage $V_{TGTA}$ and the second ET target voltage $V_{TGTB}$.

The ETIC 10 may include an auxiliary node 38 configured to output an auxiliary ET voltage $V_{CCAUX}$ to a second power amplifier 40 (denoted as "PA2"), which may be a different type of power amplifier from the power amplifier 12. Although FIG. 1 shows only one of the second power amplifier 40, it should be appreciated that the ETIC 10 can support more than one of the second power amplifier 40, either concurrently or independently. The ETIC 10 may include a switch circuit 42, which can be controlled by the control circuit 20 via the control signal 22. In a non-limiting example, the switch circuit 42 includes switches S1, S2, and S3, which can be any type of switch as appropriate. The switch S1 is provided between the first output node 16A and a coupling node 44. The switch S2 is provided between the second output node 16B and the coupling node 44. The switch S3 is provided between the auxiliary node 38 and the coupling node 44.

The ETIC 10 may also include a first hybrid circuit 46A (denoted as "SW/LDO") and a second hybrid circuit 46B (denoted as "SW/LDO"). Each of the first hybrid circuit 46A and the second hybrid circuit 46B can be controlled to operate in a switch mode as a switch or a low-dropout (LDO) mode as an LDO regulator. The first hybrid circuit 46A is provided between the first ET voltage circuit 18A and the first output node 16A. The second hybrid circuit 46B is provided between the second ET voltage circuit 18B and the second output node 16B. Accordingly, the switch S1 is coupled to the first output node 16A via the first hybrid circuit 46A and the switch S2 is coupled to the second output node 16B via the second hybrid circuit 46B.

The ETIC 10 can be configured to support a variety of types of power amplifiers via the first output node 16A, the second output node 16B, and/or the auxiliary node 38. In this regard, FIGS. 2A-2D are schematic diagrams providing exemplary illustrations of various types of power amplifiers that can be supported by the ETIC 10 in FIG. 1. Common elements between FIGS. 1 and 2A-2D are shown therein with common element numbers and will not be re-described herein.

Figure 2A:
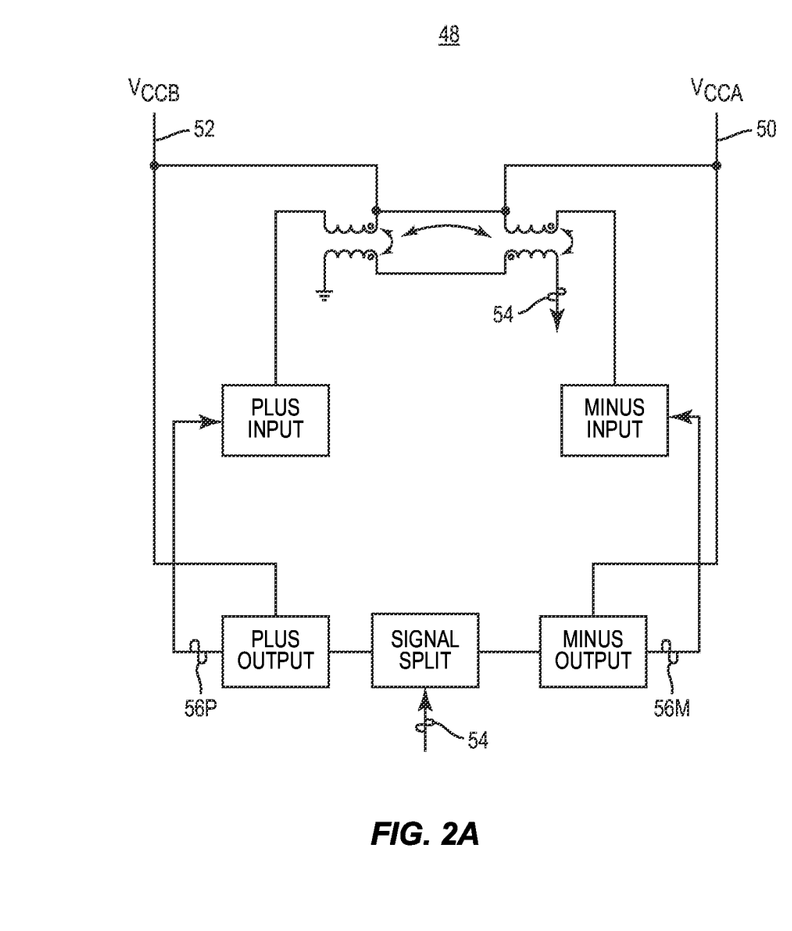
FIGS. 2A-2D are schematic diagrams providing exemplary illustrations of various types of power amplifiers that can be coupled to the ETIC in FIG. 1 to receive the ET voltages.

FIG. 2A is a schematic diagram of an exemplary differential power amplifier 48 (also referred to as "first type power amplifier"), which can be coupled to the first output node 16A and the second output node 16B as the power amplifier 12 in FIG. 1. The differential power amplifier 48 includes a first voltage input 50 and a second voltage input 52. The first voltage input 50 is coupled to the first output node 16A in FIG. 1 to receive the first ET voltage $V_{CCA}$, the first low-frequency current $I_{DCA}$, and the first high-frequency current $I_{ACA}$. The second voltage input 52 is coupled to the second output node 16B in FIG. 1 to receive the second ET voltage $V_{CCB}$, the second low-frequency current $I_{DCB}$, and the second high-frequency current $I_{ACB}$. The differential power amplifier 48 receives a radio frequency (RF) signal 54 and converts the RF signal 54 into a pair of differential RF signals 56M, 56P. Accordingly, the differential power amplifier 48 amplifies the differential RF signals 56M, 56P based on the first ET voltage $V_{CCA}$ and the second ET voltage $V_{CCB}$, respectively.

With reference back to FIG. 1, when the control circuit 20 determines (e.g., based on stored configuration information) that the power amplifier 12 is the differential power amplifier 48 in FIG. 2A, the control circuit 20 can cause the first ET voltage circuit 18A and the second ET voltage circuit 18B (e.g., via the control signal 22) to generate the first ET voltage $V_{CCA}$ and the second ET voltage $V_{CCB}$ having substantially equal instantaneous amplitudes. Herein, the first ET voltage $V_{CCA}$ and the second ET voltage $V_{CCB}$ are said to have substantially equal instantaneous amplitudes when a difference between instantaneous amplitudes of the first ET voltage $V_{CCA}$ and the second ET voltage $V_{CCB}$ is less than ten percent (<10%). The control circuit 20 may further cause the first voltage amplifier 28A and the second voltage amplifier 28B to source the first high-frequency current $I_{ACA}$ and the second high-frequency current $I_{ACB}$ having substantially equal instantaneous peak amounts. Herein, the first high-frequency current $I_{ACA}$ and the second high-frequency current $I_{ACB}$ are said to have substantially equal instantaneous peak amounts when a difference between the first high-frequency current $I_{ACA}$ and the second high-frequency current $I_{ACB}$ is less than 10%.

Figure 2B:
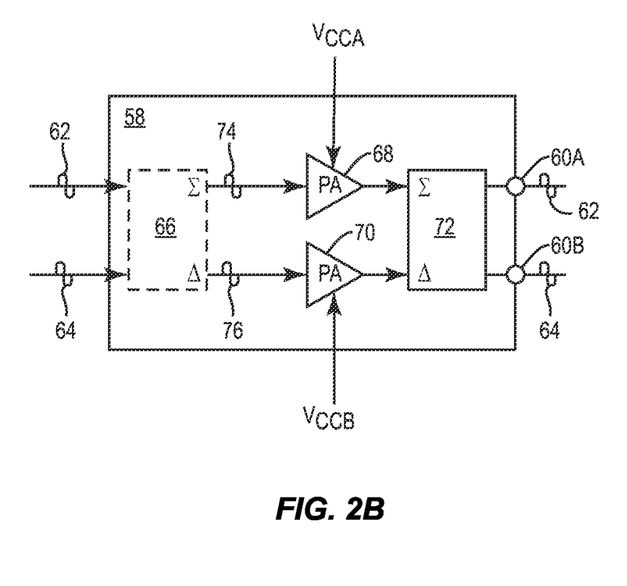

FIG. 2B is a schematic diagram of an exemplary sigma-delta power amplifier 58 (also referred to as "second type power amplifier"), which can be coupled to the first output node 16A and the second output node 16B as the power amplifier 12 in FIG. 1. The sigma-delta power amplifier 58 includes a first signal output 60A and a second signal output 60B each coupled to a respective antenna(s) (not shown). The sigma-delta power amplifier 58 is configured to receive a pair of RF signals 62, 64 having different time-variant amplitudes $A_1(t)$, $A_2(t)$ and amplify the RF signals 62, 64 for concurrent radiation via the antennas coupled to the first signal output 60A and the second signal output 60B. In this regard, the sigma-delta power amplifier 58 may be employed to enable multiple-input multiple-output (MIMO) diversity and/or MIMO spatial multiplexing.

The sigma-delta power amplifier 58 can be configured to include an input circuit 66, a sigma voltage amplifier 68, a delta voltage amplifier 70, and an output circuit 72. The input circuit 66 is configured to receive the RF signals 62, 64 and generate a summed RF signal 74 and a differential RF signal 76 having an identical average amplitude $\sqrt{A_1(t)^2+A_2(t)^2}$. The sigma voltage amplifier 68 is coupled to the first output node 16A in FIG. 1 to receive the first ET voltage $V_{CCA}$, the first low-frequency current $I_{DCA}$, and the first high-frequency current $I_{ACA}$. The delta voltage amplifier 70 is coupled to the second output node 16B in FIG. 1 to receive the second ET voltage $V_{CCB}$, the second low-frequency current $I_{DCB}$, and the second high-frequency current $I_{ACB}$. Accordingly, the sigma voltage amplifier 68 and the delta voltage amplifier 70 concurrently amplify the summed RF signal 74 and the differential RF signal 76, respectively. The output circuit 72 is configured to regenerate the RF signals 62, 64 from the summed RF signal 74 and the differential RF signal 76.

With reference back to FIG. 1, when the control circuit 20 determines (e.g., based on stored configuration information) that the power amplifier 12 is the sigma-delta power amplifier 58 in FIG. 2B, the control circuit 20 can cause the first ET voltage circuit 18A and the second ET voltage circuit 18B (e.g., via the control signal 22) to generate the first ET voltage $V_{CCA}$ and the second ET voltage $V_{CCB}$ having a substantially equal average amplitude $\sqrt{A_1(t)^2+A_2(t)^2}$. Herein, the first ET voltage $V_{CCA}$ and the second ET voltage $V_{CCB}$ are said to have substantially equal average amplitudes when a difference between average amplitudes of the first ET voltage $V_{CCA}$ and the second ET voltage $V_{CCB}$ is less than 10%. The control circuit 20 may further cause the first voltage amplifier 28A and the second voltage amplifier 28B to source the first high-frequency current $I_{ACA}$ and the second high-frequency current $I_{ACB}$ having substantially equal average peak amounts. Herein, the first high-frequency current $I_{ACA}$ and the second high-frequency current $I_{ACB}$ are said to have substantially equal average peak amounts when a difference between the first high-frequency current $I_{ACA}$ and the second high-frequency current $I_{ACB}$ is less than 10%.

Figure 2C:
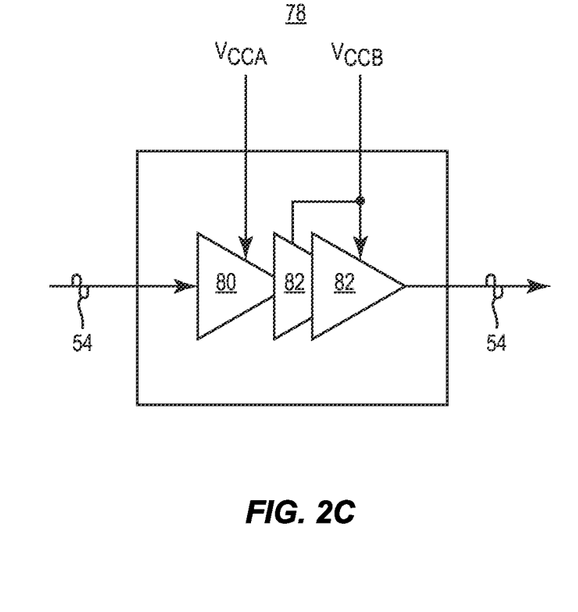

FIG. 2C is a schematic diagram of an exemplary multi-stage power amplifier 78 (also referred to as "third type power amplifier"), which can be coupled to the first output node 16A and the second output node 16B as the power amplifier 12 in FIG. 1. The multi-stage power amplifier 78 includes a driver stage amplifier 80 and one or more output stage amplifiers 82. The driver stage amplifier 80 is coupled to the first output node 16A to receive the first ET voltage $V_{CCA}$, the first low-frequency current $I_{DCA}$, and the first high-frequency current $I_{ACA}$. The output stage amplifiers 82 are all coupled to the second output node 16B to receive the second ET voltage $V_{CCB}$, the second low-frequency current $I_{DCB}$, and the second high-frequency current $I_{ACB}$.

With reference back to FIG. 1, when the control circuit 20 determines (e.g., based on stored configuration information) that the power amplifier 12 is the multi-stage power amplifier 78 in FIG. 2C, the control circuit 20 can close switches S1 and S2, while keeping switch S3 open, to couple the first output node 16A with the second output node 16B. In addition, the control circuit 20 can configure one of the first hybrid circuit 46A and the second hybrid circuit 46B to operate in the switch mode, and another one of the first hybrid circuit 46A and the second hybrid circuit 46B to operate in the LDO mode. For example, the control circuit 20 can configure (via the control signal 22) the first hybrid circuit 46A to operate in the switch mode and the second hybrid circuit 46B to operate in the LDO mode.

Figure 2D:
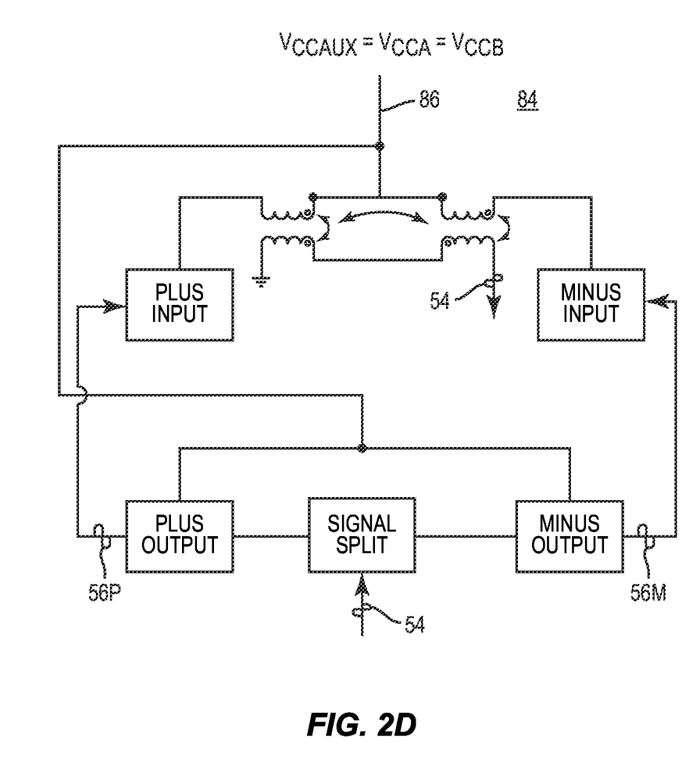

FIG. 2D is a schematic diagram of an exemplary power amplifier 84, which can be coupled to the auxiliary node 38 as the second power amplifier 40 in FIG. 1. The power amplifier 84 includes a voltage input 86 coupled to the auxiliary node 38 in FIG. 1 to receive the auxiliary ET voltage $V_{CCAUX}$, a sum of the first low-frequency current $I_{DCA}$ and the second low-frequency current $I_{DCB}$, as well as a sum of the first high-frequency current $I_{ACA}$ and the second high-frequency current $I_{ACB}$. The power amplifier 84 receives the RF signal 54 and converts the RF signal 54 into the differential RF signals 56M, 56P. Accordingly, the power amplifier 84 amplifies the differential RF signals 56M, 56P based on the auxiliary ET voltage $V_{CCAUX}$.

With reference back to FIG. 1, when the control circuit 20 determines (e.g., based on stored configuration information) that the second power amplifier 40 is the power amplifier 84 in FIG. 2D, the control circuit 20 can close switches S1, S2, and S3 (e.g., via the control signal 22). In this regard, the first tracker circuit 14A and the second tracker circuit 14B are coupled to the auxiliary node 38 to provide the sum of the first low-frequency current $I_{DCA}$ and the second low-frequency current $I_{DCB}$ to the second power amplifier 40. Additionally, the first ET voltage circuit 18A and the second ET voltage circuit 18B are also coupled to the auxiliary node 38 to provide the sum of the first high-frequency current $I_{ACA}$ and the second high-frequency current $I_{ACB}$ to the second power amplifier 40. By coupling the first ET voltage circuit 18A and the second ET voltage circuit 18B to the auxiliary node 38, the auxiliary ET voltage $V_{CCAUX}$ is equal to the first ET voltage $V_{CCA}$ and the second ET voltage $V_{CCB}$ ($V_{CCAUX}=V_{CCA}=V_{CCB}$).

The ETIC 10 can be further configured to operate in an average power tracking (APT) mode. In this regard, the control circuit 20 can deactivate the first ET voltage circuit 18A and the second ET voltage circuit 18B. Instead, the control circuit 20 can control the first tracker circuit 14A and the second tracker circuit 14B to output any one of the first low-frequency voltage $V_{DCA}$ and the second low-frequency voltage $V_{DCB}$ as an APT voltage via any of the first output node 16A, the second output node 16B, and the auxiliary node 38.

Figure 3A:
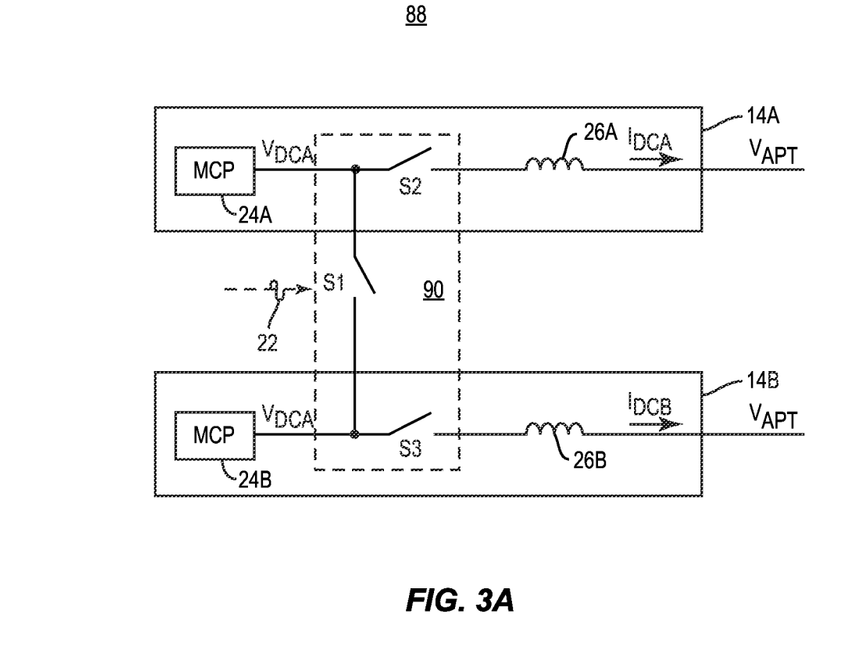
FIGS. 3A and 3B are schematic diagram providing exemplary illustrations of different configurations of a tracker circuit in the ETIC of FIG. 1.

FIG. 3A is a schematic diagram of an exemplary tracker circuit 88, which can replace the first tracker circuit 14A and the second tracker circuit 14B in the ETIC 10 of FIG. 1 to continuously supply an APT voltage $V_{APT}$. Common elements between FIGS. 1 and 3A are shown therein with common element numbers and will not be re-described herein.

The tracker circuit 88 may be configured to include a switch network 90 that includes switches S1, S2, and S3. The switch S1 is provided between the first tracker circuit 14A and the second tracker circuit 14B. The switch S2 is provided between the first MCP 24A and the first power inductor 26A. The switch S3 is provided between the second MCP 24B and the second power inductor 26B.

The control circuit 20 can control the switch network 90 (e.g., via the control signal 22) to alternately couple the first MCP 24A and the second MCP 24B to a selected one of the first power inductor 26A and the second power inductor 26B. For example, if the first tracker circuit 14A is configured to output the APT voltage $V_{APT}$ via the first output node 16A in FIG. 1, the control circuit 20 will alternately couple the first MCP 24A (by closing S2 and opening S1, S3) and the second MCP 24B (by closing S1, S2 and opening S3) to the first power inductor 26A. In this regard, the second MCP 24B can be charged when the first MCP 24A is coupled to the first power inductor 26A and the first MCP 24A can be charged when the second MCP 24B is coupled to the first power inductor 26A. As a result, the ETIC 10 is able to continuously supply the APT voltage $V_{APT}$ in the APT mode.

Figure 3B:
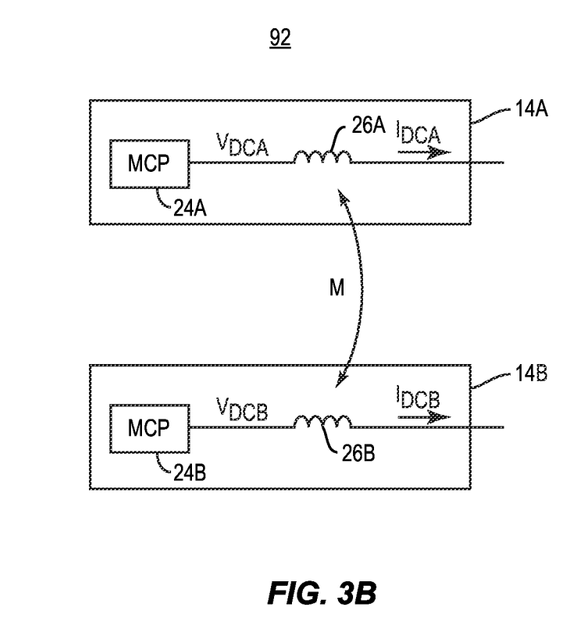

FIG. 3B is a schematic diagram of an exemplary tracker circuit 92, which can be provided in the ETIC 10 of FIG. 1 to replace the first tracker circuit 14A and the second tracker circuit 14B when the power amplifier 12 is not the second type power amplifier. Common elements between FIGS. 1 and 3B are shown therein with common element numbers and will not be re-described herein.

In a non-limiting example, the first power inductor 26A can be electrically coupled to the second power inductor 26B. As such, the first power inductor 26A and the second power inductor 26B can be integrated into a single package to help reduce footprint of the ETIC 10.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
    a first output node and a second output node coupled to a power amplifier;
    a first tracker circuit configured to generate a first low-frequency current at the first output node;
    a second tracker circuit configured to generate a second low-frequency current at the second output node;
    a first ET voltage circuit configured to generate a first ET voltage at the first output node based on a first ET target voltage;
    a second ET voltage circuit configured to generate a second ET voltage at the second output node based on a second ET target voltage; and
    a control circuit configured to:
        determine a type of the power amplifier;
        cause the first tracker circuit and the second tracker circuit to generate the first low-frequency current and the second low-frequency current, respectively, independent of the type of the power amplifier; and
        cause the first ET voltage circuit and the second ET voltage circuit to generate the first ET voltage and the second ET voltage, respectively, in accordance with the type of the power amplifier.

2. The ETIC of claim 1 wherein the control circuit is further configured to cause the first tracker circuit and the second tracker circuit to generate the first low-frequency current and the second low-frequency current that are identical.

3. The ETIC of claim 1 wherein the control circuit is further configured to cause the first ET voltage circuit and the second ET voltage circuit to generate the first ET voltage and the second ET voltage having substantially equal instantaneous amplitudes when the power amplifier is determined to be a first type power amplifier.

4. The ETIC of claim 3 wherein the first type power amplifier is a differential power amplifier configured to amplify a radio frequency (RF) signal based on the first ET voltage and the second ET voltage.

5. The ETIC of claim 3 wherein:
    the first ET voltage circuit is further configured to provide a first high-frequency peak current to the first output node;
    the second ET voltage circuit is further configured to provide a second high-frequency peak current to the second output node; and
    the control circuit is further configured to cause the first ET voltage circuit and the second ET voltage circuit to generate the first high-frequency peak current and the second high-frequency peak current having substantially equal instantaneous peak amounts when the power amplifier is determined to be the first type power amplifier.

6. The ETIC of claim 1 wherein the control circuit is further configured to cause the first ET voltage circuit and the second ET voltage circuit to generate the first ET voltage and the second ET voltage having substantially equal average amplitudes when the power amplifier is determined to be a second type power amplifier.

7. The ETIC of claim 6 wherein the second type power amplifier is a sigma-delta power amplifier configured to concurrently amplify two different radio frequency (RF) signals based on the first ET voltage and the second ET voltage.

8. The ETIC of claim 7 wherein:
the first ET voltage circuit is further configured to provide a first high-frequency peak current to the first output node;
the second ET voltage circuit is further configured to provide a second high-frequency peak current to the second output node; and
the control circuit is further configured to cause the first ET voltage circuit and the second ET voltage circuit to generate the first high-frequency peak current and the second high-frequency peak current having substantially equal average peak amounts when the power amplifier is determined to be the second type power amplifier.

9. The ETIC of claim 1 further comprising a switch circuit coupled between the first output node and the second output node.

10. The ETIC of claim 9 further comprising:
a first hybrid circuit coupled between the first ET voltage circuit and the first output node; and
a second hybrid circuit coupled between the second ET voltage circuit and the second output node;
wherein the first hybrid circuit and the second hybrid circuit are each configured to operate in a switch mode or a low-dropout (LDO) mode.

11. The ETIC of claim 10 wherein the control circuit is further configured to:
control the switch circuit to couple the first output node with the second output node when the power amplifier is a third type power amplifier;
control one of the first hybrid circuit and the second hybrid circuit to operate in the switch mode; and
control another one of the first hybrid circuit and the second hybrid circuit to operate in the LDO mode.

12. The ETIC of claim 11 wherein the third type power amplifier is a multi-stage power amplifier comprising:
a driver stage amplifier coupled to the first output node to receive the first ET voltage; and
one or more output stage amplifiers each coupled to the second output node to receive the second ET voltage;
wherein the driver stage amplifier and the one or more output stage amplifiers are configured to collectively amplify a radio frequency (RF) signal.

13. The ETIC of claim 9 further comprising:
an auxiliary node coupled to the switch circuit and a second power amplifier;
wherein the control circuit is further configured to control the switch circuit to couple the first tracker circuit and the second tracker circuit to the auxiliary node such that the second power amplifier receives a sum of the first low-frequency current and the second low-frequency current.

14. The ETIC of claim 13 wherein the second power amplifier is a multi-stage power amplifier comprising a driver stage amplifier and an output stage amplifier each coupled to the auxiliary node and configured to collectively amplify a radio frequency (RF) signal.

15. The ETIC of claim 1 wherein each of the first tracker circuit and the second tracker circuit comprises:
a multi-level charge pump (MCP) configured to generate a low-frequency voltage; and
a power inductor coupled to the MCP and configured to induce a respective one of the first low-frequency current and the second low-frequency current based on the low-frequency voltage.

16. The ETIC of claim 15 further comprising a switch network coupled to the first tracker circuit and the second tracker circuit, wherein the control circuit is further configured to control the switch network to alternately couple the MCP in the first tracker circuit and the MCP in the second tracker circuit to the power inductor in a selected one of the first tracker circuit and the second tracker circuit.

17. The ETIC of claim 15 wherein the control circuit is further configured to deactivate the first ET voltage circuit and the second ET voltage circuit.

18. The ETIC of claim 15 wherein the power inductor in the first tracker circuit is electrically coupled to the power inductor in the second tracker circuit.

19. The ETIC of claim 1 wherein each of the first ET voltage circuit and the second ET voltage circuit comprises:
a voltage amplifier configured to generate an initial ET voltage based on a respective one of the first ET target voltage and the second ET target voltage and a respective one of a lower supply voltage and a higher supply voltage; and
an offset capacitor configured to raise the initial ET voltage by an offset voltage to generate a respective one of the first ET voltage and the second ET voltage.

20. The ETIC of claim 19 further comprising:
a target voltage circuit configured to generate the first ET target voltage and the second ET target voltage; and
a supply voltage circuit configured to generate the lower supply voltage and the higher supply voltage.

* * * * *